(12) United States Patent
Jeong et al.

(10) Patent No.: US 9,379,062 B2
(45) Date of Patent: Jun. 28, 2016

(54) SEMICONDUCTOR PACKAGE

(71) Applicant: Samsung Electronics Co., Ltd., Suwon-si, Gyeonggi-do (KR)

(72) Inventors: Ki-hong Jeong, Jeonju-si (KR); Sang-sub Song, Suwon-si (KR); Sang-ho An, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/331,069

(22) Filed: Jul. 14, 2014

(65) Prior Publication Data

US 2015/0021787 A1 Jan. 22, 2015

(30) Foreign Application Priority Data

Jul. 17, 2013 (KR) ........................ 10-2013-0084377

(51) Int. Cl.
*H01L 23/538* (2006.01)
*H01L 25/065* (2006.01)
*H01L 23/00* (2006.01)

(52) U.S. Cl.
CPC ........ *H01L 23/5384* (2013.01); *H01L 23/5383* (2013.01); *H01L 25/0652* (2013.01); *H01L 25/0657* (2013.01); *H01L 24/73* (2013.01); *H01L 2224/0401* (2013.01); *H01L 2224/04042* (2013.01); *H01L 2224/05554* (2013.01); *H01L 2224/06135* (2013.01); *H01L 2224/16145* (2013.01); *H01L 2224/32145* (2013.01); *H01L 2224/32225* (2013.01); *H01L 2224/48091* (2013.01); *H01L 2224/48137* (2013.01); *H01L 2224/48145* (2013.01); *H01L 2224/48147* (2013.01); *H01L 2224/48227* (2013.01); *H01L 2224/49175* (2013.01); *H01L 2224/73257* (2013.01); *H01L 2224/73265* (2013.01);
(Continued)

(58) Field of Classification Search
CPC ........................ H01L 23/5384; H01L 25/0657
USPC .................. 257/774, 776, 686, 676, E23.169
See application file for complete search history.

(56) References Cited

U.S. PATENT DOCUMENTS 7,880,312 B2   2/2011   Okumura
7,989,960 B2   8/2011   Shinohara et al.
(Continued)

FOREIGN PATENT DOCUMENTS

KR   20010062929 A   7/2001

*Primary Examiner* — Cuong Q Nguyen
*Assistant Examiner* — Tong-Ho Kim
(74) *Attorney, Agent, or Firm* — Renaissance IP Law Group LLP

(57) ABSTRACT

Provided is a semiconductor package including a plurality of first semiconductor chips that are stacked on a substrate and a second semiconductor chip disposed on the plurality of first semiconductor chips. The plurality of first semiconductor chips comprises a first semiconductor chip group and a second semiconductor chip group. The first semiconductor chip group is electrically connected to the second semiconductor chip through a first channel. The second semiconductor chip group is electrically connected to the second semiconductor chip through a second channel. At least one of the first channel and the second channel extends along a top surface of the first semiconductor chip which is disposed on the uppermost side, or top of the stack, among the plurality of first semiconductor chips. The inventive concept may provide the semiconductor package having a high operation speed, low power consumption, and a small thickness and capable of being manufactured at low costs.

20 Claims, 12 Drawing Sheets

(52) U.S. Cl.
CPC .................. *H01L2225/0651* (2013.01); *H01L 2225/06506* (2013.01); *H01L 2225/06513* (2013.01); *H01L 2225/06541* (2013.01); *H01L 2225/06562* (2013.01); *H01L 2924/15192* (2013.01); *H01L 2924/15311* (2013.01)

(56) References Cited

U.S. PATENT DOCUMENTS

| | | |
|---|---|---|
| 8,178,960 B2 | 5/2012 | Oh |
| 8,299,627 B2 | 10/2012 | Kim et al. |
| 2006/0087013 A1* | 4/2006 | Hsieh .............................. 257/678 |
| 2008/0254571 A1 | 10/2008 | Corisis et al. |
| 2009/0065948 A1* | 3/2009 | Wang .............................. 257/777 |
| 2009/0200680 A1* | 8/2009 | Shinohara et al. ............. 257/773 |
| 2010/0109141 A1* | 5/2010 | Nishiyama et al. ............ 257/690 |
| 2010/0244227 A1 | 9/2010 | Kim et al. |
| 2010/0270689 A1* | 10/2010 | Kim et al. ....................... 257/777 |
| 2011/0037158 A1 | 2/2011 | Youn et al. |
| 2011/0180937 A1 | 7/2011 | Choi et al. |
| 2014/0319679 A1* | 10/2014 | Lin et al. ........................ 257/737 |

* cited by examiner

SEMICONDUCTOR PACKAGE

CROSS-REFERENCE TO RELATED APPLICATIONS

This application claims the benefit of Korean Patent Application No. 10-2013-0084377, filed on Jul. 17, 2013, in the Korean Intellectual Property Office, the disclosure of which is incorporated herein in its entirety by reference.

BACKGROUND

The inventive concept relates to a semiconductor package, and more particularly, to a semiconductor package characterized by high operational speed, low power consumption, reduced thickness, and low manufacturing cost.

In order to maintain low power consumption and to increase an operation speed of a semiconductor device, two or more channels are used. That is, there is an increasing number of semiconductor devices configured such that a controller and a memory device communicate with each other through two or more channels. However, when two or more channels are used, the cost of a substrate increases due to a complicated routing, and there is a tendency for a semiconductor device to increase in thickness as a whole. Accordingly, this problem needs to be solved.

SUMMARY

The inventive concept provides a semiconductor package having a high operation speed, low power consumption, and a small thickness and capable of being manufactured at low costs.

According to an aspect of the inventive concept, there is provided a semiconductor package including: a plurality of first semiconductor chips that are stacked on a substrate; and a second semiconductor chip disposed on the plurality of first semiconductor chips, wherein the plurality of first semiconductor chips include a first semiconductor chip group and a second semiconductor chip group, wherein the first semiconductor chip group is electrically connected to the second semiconductor chip through a first channel, wherein the second semiconductor chip group is electrically connected to the second semiconductor chip through a second channel, and wherein at least one of the first channel and the second channel extends along a top surface of the first semiconductor chip which is disposed on the uppermost side, or top of the stack, among the plurality of first semiconductor chips.

At least one of the first channel and the second channel may extend by a redistribution layer or an interposer formed on or near the top surface. The second semiconductor chip may be a controller for controlling the first semiconductor chips.

The substrate may include an insulator having a first surface and a second surface which is opposite to the first surface, a first substrate wiring formed on the first surface and a second substrate wiring formed on the second surface, and a via for connecting the first substrate wiring and the second substrate wiring, and wherein an electrical wiring is not formed between the first surface and the second surface.

The other one of the first channel and the second channel may be configured to connect the first semiconductor chips and the second semiconductor chip to each other through the substrate.

The second semiconductor chip may be electrically and directly connected to the substrate in order to be connected to an external device.

According to another aspect of the inventive concept, there is provided a semiconductor device including: a plurality of memory devices that are stacked on a substrate; and a controller device that is disposed on the plurality of memory devices and is capable of controlling the plurality of memory devices, wherein the memory devices include a first semiconductor chip group and a second semiconductor chip group, wherein the first semiconductor chip group is electrically connected to the controller device through a first channel, wherein the second semiconductor chip group is electrically connected to the controller device through a second channel, and wherein the second channel electrically connects the controller device and the second semiconductor chip group via the substrate.

The first channel may electrically connect the controller device and the first semiconductor chip group to each other via a top surface of the memory device which is disposed on the uppermost side, among the memory devices.

The plurality of memory devices may further include a third semiconductor chip group and a fourth semiconductor chip group, wherein the third semiconductor chip group is electrically connected to the controller device through a third channel, wherein the fourth semiconductor chip group is electrically connected to the controller device through a fourth channel, and wherein the first channel, the third channel, and the fourth channel electrically connect the controller device to the first semiconductor chip group, the third semiconductor chip group, and the fourth semiconductor chip group, respectively, via a top surface of the memory device which is disposed on the uppermost side, among the memory devices.

At least one of the first channel, the third channel, and the fourth channel may electrically connect the controller device to the first semiconductor chip group, the third semiconductor chip group, and/or the fourth semiconductor chip group, respectively, via a redistribution layer on the top surface of the memory device which is disposed on the uppermost side, among the memory devices. The redistribution layer may include a wiring formed of gold (Au), aluminum (Al), and/or copper (Cu).

At least one of the first channel, the third channel, and the fourth channel may electrically connect the controller device to the first semiconductor chip group, the third semiconductor chip group, and/or the fourth semiconductor chip group, respectively, through an interposer on the top surface of the memory device which is disposed on the uppermost side, or top of the stack, among the memory devices.

One of the first channel, the third channel, and the fourth channel may electrically connect the controller device to the first semiconductor chip group, the third semiconductor chip group, and/or the fourth semiconductor chip group through a redistribution layer (RDL) formed on or near the top surface of the memory device which is disposed on the uppermost side.

The plurality of memory devices may be stacked while being offset, and may be stacked while being offset in two or more directions.

The substrate may be a substrate having a 2-layer structure in which a wiring is formed only both surfaces other than the inside thereof.

According to yet another aspect of the inventive concept, there is provided a semiconductor package including a substrate; two or more first semiconductor chips in a first semiconductor group, the two or more first semiconductor chips in the first group being stacked one atop the other above the substrate; two or more first semiconductor chips in a second semiconductor group, the two or more first semiconductor chips in the second group being stacked one atop the other above the substrate; the first and the second semiconductor groups being stacked one atop the other above the substrate; a second semiconductor chip stacked above a top-most one of the first semiconductor chips; and two or more channels corresponding with the two or more first semiconductor chips in the first and second semiconductor groups, each of the two or more channels electrically connecting the two or more first semiconductor chips in a corresponding one of the first and second semiconductor groups to the second semiconductor chip, the two or more channels being physically separate from one another.

The first semiconductor chips within the first and second chip groups may be memory devices, and the second semiconductor chip may be a memory controller device. The substrate provides one or more input and and/or output (I/O) terminals for external electrical connection to the semiconductor package and, in accordance with one embodiment of the inventive concept, includes no more than two-layer structure characterized by one or two external surface wirings but no internal wirings, routes signals associated with at least one of the two or more channels, and provides one or more input and/or output (I/O) terminals for external connection to the semiconductor package.

In accordance with one embodiment of the inventive concept, the two or more channels each comprises laterally and vertically extending electrical conductors that cascade outwardly and downwardly between the second semiconductor chip and the substrate, wherein the electrical conductors are selected from a group consisting of bonding wires, through silicon vias (TSVs), and solder bumps. The first semiconductor chips in the first and second groups are laterally offset from one another in at least one direction to complement the outwardly and downwardly cascading electrical conductors that interconnect them, and, in accordance with two embodiments of the inventive concept, the first semiconductor chips in the first and second groups are laterally offset from one another in at least one, and alternatively in two directions, each of which is different from the others.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The inventive concept will now be described more fully with reference to the accompanying drawings, in which exemplary embodiments of the inventive concept are shown. The inventive concept may, however, be embodied in many different forms by one of ordinary skill in the art without departing from the technical teaching of the inventive concept. In other words, particular structural and functional description of the inventive concept are provided in descriptive sense only; various changes in form and details may be made therein and thus should not be construed as being limited to the embodiments set forth herein. The inventive concept is not limited to the embodiments described in the present description. Thus it should not be understood that the inventive concept includes every kind of variation examples or alternative equivalents included in the spirit and scope of the inventive concept.

In the present description, terms such as 'first', 'second', etc. are used to describe various elements. However, it is obvious that the elements should not be defined by these terms. The terms are used only for distinguishing one element from another element. For example, a first element which could be termed a second element, and similarly, a second element may be termed a first element, without departing from the teaching of the inventive concept.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one of," when preceding a list of elements, modify the entire list of elements and do not modify the individual elements of the list.

Figure 1:
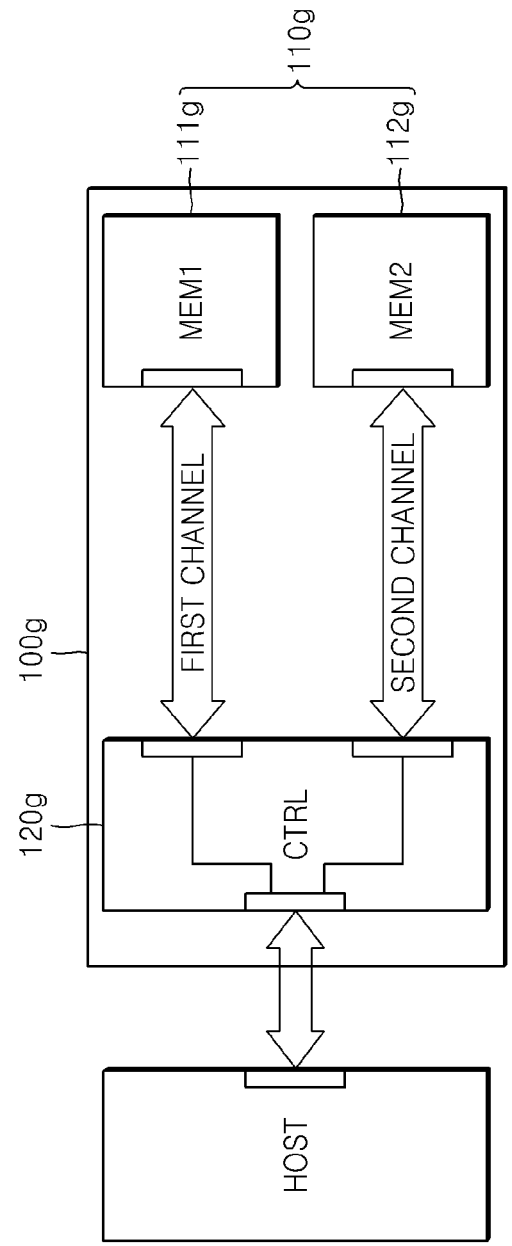
FIG. 1 is a conceptual diagram illustrating a relation between a semiconductor package and a host and a configuration of the semiconductor package, according to an embodiment of the inventive concept.

FIG. 1 is a conceptual diagram illustrating a relation between a semiconductor package 100g and a host and a configuration of the semiconductor package 100g, according to an embodiment of the inventive concept. Referring to FIG. 1, the semiconductor package 100g according to the current embodiment may be connected to the host so as to transmit and receive signals and/or data.

The host may be, for example, electronics such as a personal computer (PC), a notebook computer, a mobile phone, a tablet PC, or a smart TV, or may be a main board or a graphic card which is embedded in those electronics, or may be any other suitable host device. However, the inventive concept is not limited thereto.

An input and output interface between the host and the semiconductor package 100g may have a plug-socket structure for connecting input and output terminals to each other, or may have a structure in which a bump is coupled onto a pad.

The semiconductor package 100g may be configured such that a controller 120g and a storage device 110g are mounted on a substrate. The storage device 110g may include a plurality of storage device groups, for example, a first storage device 111g and a second storage device 112g. The controller 120g may control communication between the host and the storage device 110g.

The first storage device 111g and the second storage device 112g may be connected to the controller 120g through separate channels. In other words, the first storage device 111g may be configured to communicate with the controller 120g through a first channel, and the second storage device 112g may be configured to communicate with the controller 120g through a second channel.

The controller 120g may be provided with a terminal for performing inputting and outputting with an external device through the first channel, and/or it may be provided with another terminal for performing inputting and outputting with another external device through the second channel.

Figure 2:
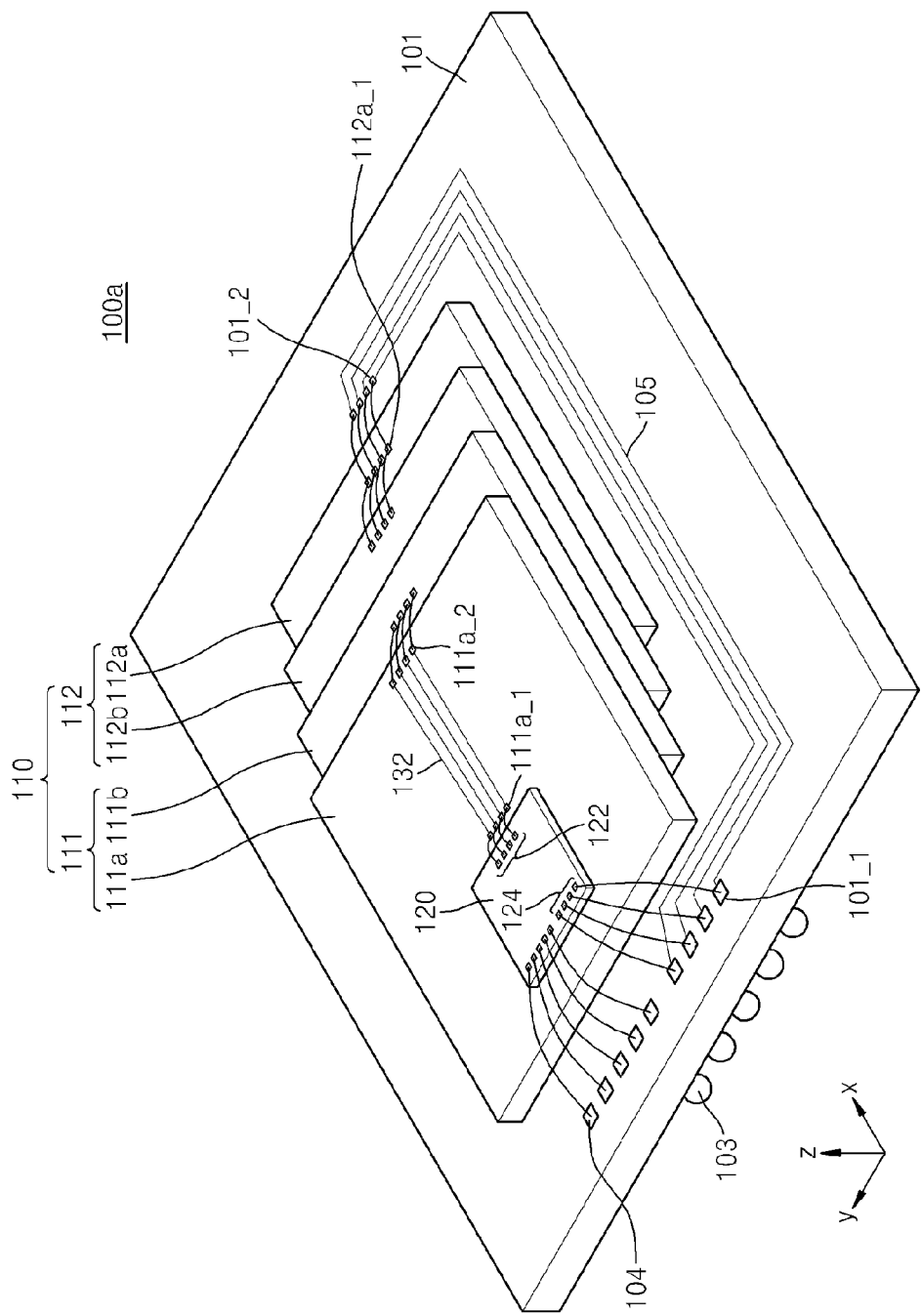
FIG. 2 is an isometric view illustrating a semiconductor package according to an embodiment of the inventive concept.

FIG. 2 is an isometric view illustrating a semiconductor package 100a according to an embodiment of the inventive concept.

Referring to FIG. 2, a plurality of first semiconductor chips 110 may be vertically stacked on a substrate 101. In addition, a second semiconductor chip 120 may be disposed on the vertically stacked first semiconductor chips 110.

The substrate 101 may be a printed circuit board, a flexible printed circuit board, a tape substrate, or the like, but is not limited thereto. The substrate 101 may be a substrate in which a wiring is provided only on the top surface and/or bottom surface thereof, wherein a wiring that passes through inside of the substrate 101 and that transmits signals/data in a direction parallel to a main surface of the substrate 101 therein is not provided. This will be described below in detail with reference to FIG. 3.

The plurality of first semiconductor chips 110 may be divided into a first semiconductor chip group 111 and a second semiconductor chip group 112. The first semiconductor chip group 111 may transmit and receive signals and/or data to and from the second semiconductor chip 120 through the first channel. The second semiconductor chip group 112 may transmit and receive signals and/or data to and from the second semiconductor chip 120 through the second channel. Those of skill in the art will appreciate that first semiconductor chip group 111 and second semiconductor chip group 112 may be of the same number or different numbers. In other words, first semiconductor chips in the group may include more or fewer than two chips and second semiconductor ships in the group may include more or fewer than two chips.

The first semiconductor chip group 111 may include one or more first semiconductor chips. Herein, although a case where the first semiconductor chip group 111 includes two first semiconductor chips 111a and 111b has been described, the number of first semiconductor chips included in the first semiconductor chip group 111 alternatively may be one or may be more than two.

The second semiconductor chip group 112 may include one or more first semiconductor chips. Described and illustrated herein is an embodiment in which the second semiconductor chip group 112 includes two first semiconductor chips 112a and 112b. Nevertheless, those of skill in the art will appreciate that the number of first semiconductor chips included in the second semiconductor chip group 112 alternatively may be any positive integer, e.g. the number may be as few as one or three or more.

The first semiconductor chip group 111 and the second semiconductor chip group 112 may be stacked while being offset in a same direction as illustrated in FIG. 2, or may be stacked while being offset in two or more directions that are different from one another. The second semiconductor chip group 112 may be disposed on the first semiconductor chip group 111, and the first semiconductor chip group 111 may be disposed on the second semiconductor chip group 112. Although FIG. 2 illustrates an example in which the first semiconductor chip group 111 is disposed on the second semiconductor chip group 112, the inventive concept is not limited thereto.

The plurality of first semiconductor chips 110 may be, for example, a flash memory, a phase-change RAM (PRAM), a resistive RAM (RRAM), a ferroelectric RAM (FeRAM), or a magnetic RAM (MRAM), but the inventive concept is not limited thereto. The flash memory may be, for example, a NAND flash memory. Other embodiments are contemplated as being within the spirit and scope of the invention.

The second semiconductor chip 120 may be disposed on a first semiconductor chip 111a which is disposed on the uppermost side of the first semiconductor chip group 111. For example, the second semiconductor chip 120 may be a controller for controlling inputting and outputting of signals/data between an external host and the plurality of first semiconductor chips 110. The second semiconductor chip 120 may be programmed to incorporate a program capable of transmitting and receiving signals to and from an external device, using a method according to a serial advanced technology attachment (SATA) standard, a parallel advanced technology attachment (PATA) standard, or a small computer system interface (SCSI) standard. Here, the SATA standard includes all SATA-based standards such as SATA-2, SATA-3 or e-SATA (external SATA), in addition to so-called SATA-1. The PATA standard includes all IDE-based standards such as integrated drive electronics (IDE) or enhanced-IDE (E-IDE). In this application, Serial ATA Revision 2.6 published on 15 Feb. 2007 in the Serial ATA International Organization is incorporated in its entirety by this reference.

In addition, the second semiconductor chip 120 may further perform functions of wear leveling, error correction, and/or fail block control. Alternatively, a separate auxiliary controller chip may be included to perform the functions of wear leveling, error correction, and/or fail block control.

The second semiconductor chip 120 may be connected to the substrate 101 in order to communicate with an external device. More specifically, the second semiconductor chip 120 may be electrically connected to terminals 104 on the top surface of the substrate 101 in order to communicate with the external device. The terminals 104 on the top surface may be electrically connected to terminals 103 on the bottom surface of the substrate 101, and the terminals 103 on the bottom surface may electrically connect the semiconductor package to the external device. Those of skill in the art will appreciate that top and bottom surfaces are interchangeable.

Although FIG. 2 illustrates that the terminals 103 may be solder balls capable of being connected to the external device, the inventive concept is not limited thereto. Alternatively, the terminals 103 may be arbitrary terminals such as a lead line or a pad. In addition, although FIG. 2 illustrates that the terminals 103 are disposed on the bottom surface of the substrate 101, the terminals 103 may be disposed on the top surface of the substrate 101 or may be disposed on both the top surface and the bottom surface of the substrate 101.

The second semiconductor chip 120 may be configured to transmit and receive signals/data to and from the first semiconductor chips 110 through the first channel and/or the second channel. One surface of the second semiconductor chip 120 may be provided with first channel terminals 122 to be connected to the first semiconductor chip group 111 through the first channel and second channel terminals 124 to be connected to the second semiconductor chip group 112 through the second channel.

A redistribution layer (RDL) 132 including conductive lines may be provided on the top surface of the first semiconductor chip 111a. The first semiconductor chip 111a is located on the uppermost side of the first semiconductor chip group 111. The RDL 132 transmits and receives (or distributes) signals/data to and from the second semiconductor chip 120 through the first channel. As illustrated in FIG. 2, the second semiconductor chip 120 may be disposed directly on the first semiconductor chip 111a, and the first channel terminals 122 may be connected to one end of the conductive lines in the redistribution layer 132 through terminals 111a_1 on the first semiconductor chip 111a.

The other end of the conductive lines in the redistribution layer 132 may extend up to the vicinity of an edge of the first semiconductor chip 111a. This enables an electrical connection between terminals 111a_2 and a first semiconductor chip 111b disposed below the first semiconductor chip 111a. An internal circuit of the first semiconductor chip 111a may be electrically connected to any one of the terminals 111a_1 and 111a_2 at one or both ends of the conductive lines in the redistribution layer 132.

For example, the redistribution layer may be formed on a passivation layer of the first semiconductor chip 111a, and may be a wiring formed of aluminum (Al), copper (Cu), and/or gold (Au). FIG. 2 illustrates that the redistribution layer (RDL) 132 is exposed. Alternatively, the redistribution layer may be configured to be formed within or on a separate interlayer dielectric (ILD) below the passivation layer of the first semiconductor chip 111a that is then covered with the passivation layer.

Thus, RDL 132 will be understood to be on or near a top surface of the top-most first semiconductor chip.

Although FIG. 2 illustrates that electrical connection between the first semiconductor chips 111a and 111b of the first semiconductor chip group 111 is made by bonding wires, the inventive concept is not limited thereto. The first semiconductor chips 111a and 111b may be connected to each other using another connecting method such as a through silicon via (TSV) or a solder bump.

The second semiconductor chip 120 may be connected to the substrate 101 in order to be electrically connected to the second semiconductor chip group 112 through the second channel. That is, the second channel terminals 124 may be connected to first substrate terminals 101_1. The first substrate terminals 101_1 may be electrically connected to second substrate terminals 101_2 through a substrate wiring 105, wherein the second substrate terminals 101_2 are disposed in the vicinity of terminals 112a_1 on the first semiconductor chip 112a which is located on the lowermost side of the second semiconductor chip group 112.

The second substrate terminals 101_2 may be electrically connected to the terminals 112a_1 of the first semiconductor chip 112a.

Although FIG. 2 illustrates that electrical connection between the first semiconductor chips 112a and 112b of the second semiconductor chip group 112 is made by the bonding wires, the inventive concept is not limited thereto. The first semiconductor chips 112a and 112b may be connected to each other using another connecting method such as a through silicon via (TSV), a solder bump, or any other suitable electrical connector.

Figure 3:
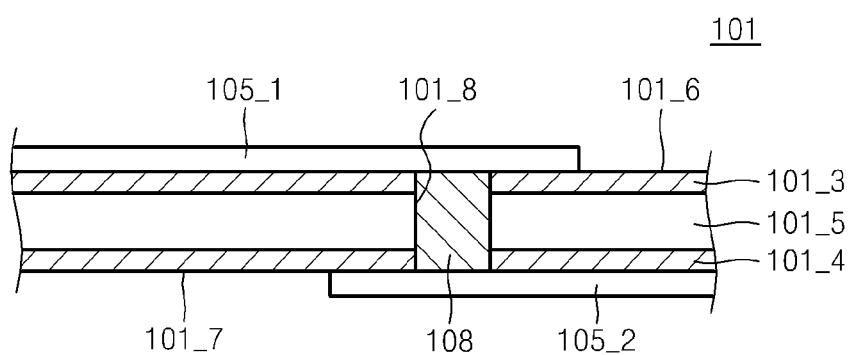
FIG. 3 is a partial cross-sectional view of a portion of a substrate of FIG. 2.

FIG. 3 is a partial cross-sectional view of a portion of the substrate 101 of FIG. 2. Referring to FIG. 3, the substrate 101 may include a core board 101_5 having top and bottom surfaces, and a first resin layer 101_3 and a second resin layer 101_4 which are disposed on the top surface and the bottom surface, respectively. The first resin layer 101_3 and/or the second resin layer 101_4 thus constitute what may be thought of as a multi-layered structure. In accordance with one embodiment of the inventive concept, no electrical wiring is formed between the first resin layer 101_3 and the second resin layer 101_4.

The core board 101_5, the first resin layer 101_3, and the second resin layer 101_4 may include at least one material from among a glass fiber, an epoxy resin, and a polyimide resin. In addition, a prepreg layer may further be interposed between the core board 101_5 and the first resin layer 101_3 or between the core board 101_5 and the second resin layer 101_4. Typically, the core board 101_5, the first resin layer 101_3, and the second resin layer 101_4 may be insulators.

An exposed surface of the first resin layer 101_3 may constitute a first surface 101_6 of the substrate 101, and an exposed surface of the second resin layer 101_4 may constitute a second surface 101_7 of the substrate 101. A first substrate wiring 105_1 may be formed on the first surface 101_6, and a second substrate wiring 105_2 may be formed on the second surface 101_7.

In addition, the substrate 101 may be provided with a via hole 101_8 passing through the substrate 101, and a via 108 for connecting the first substrate wiring 105_1 and the second substrate wiring 105_2 may be formed in the via hole 101_8.

An electrical wiring in accordance with one embodiment of the invention is not formed between the first surface 101_6 and the second surface 101_7 of the substrate 101. Thus the inventive concept contemplates a substrate in which an electrical wiring is not formed between the first surface 101_6 and the second surface 101_7 of the substrate 101. The beneficial result is higher yield and lower costs. This will be explained further below.

As the number of electrical wiring layers within a substrate increases, the cost of the substrate rapidly increases. Accordingly, a two-layer substrate 101 featuring only a 2-layer structure may be provided at extremely low cost. In addition, the substrate 101 may be configured to be thinner than a substrate provided with an internal electrical wiring, and thus the continuous drive further to miniaturize electronic devices is satisfied.

Furthermore, as the number of electrical wiring layers within the substrate increases, the thickness of the substrate itself increases, which confounds the goals of weight and size reduction of the semiconductor device.

Figure 4:
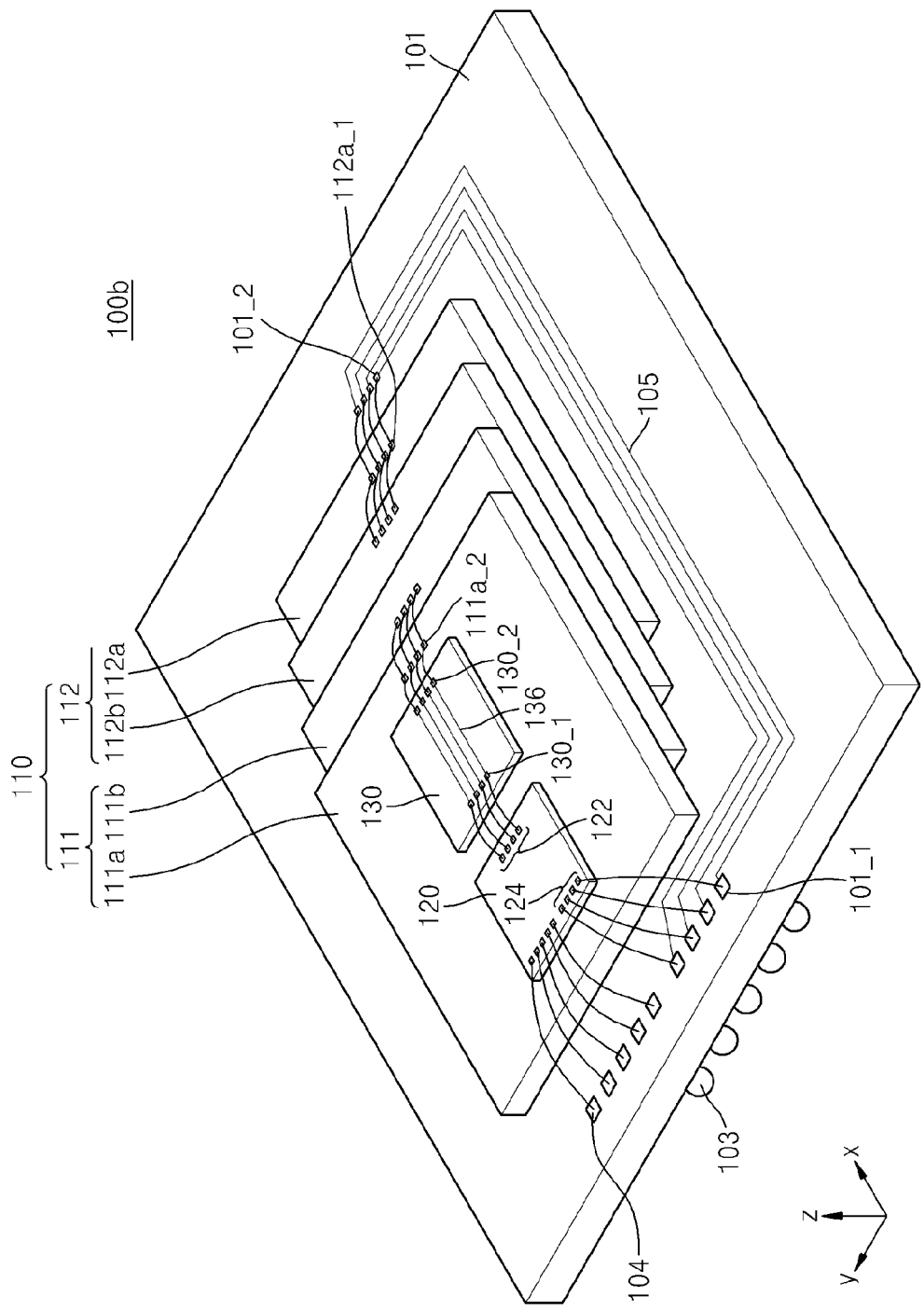
FIGS. 4 to 6 are isometric views illustrating a semiconductor package according to other embodiments of the inventive concept.

FIG. 4 is an isometric view of a semiconductor package 100b according to another embodiment of the inventive concept.

Referring to FIG. 4, a plurality of first semiconductor chips 110 may be stacked on a substrate 101, and a second semiconductor chip 120 may be disposed on the stacked first semiconductor chips 110.

The substrate 101, the plurality of first semiconductor chips 110, and the second semiconductor chip 120 have been described in detail in the embodiment of FIG. 2, and thus the detailed description thereof will be omitted.

Although the second semiconductor chip 120 is connected to a first semiconductor chip 111a disposed on the uppermost side of a first semiconductor chip group 111, through a redistribution layer 132 in the embodiment of FIG. 2, the second semiconductor chip 120 alternatively may be connected to the first semiconductor chip 111a through an interposer 130 in the embodiment of FIG. 4.

More specifically, in the interposer 130, an interposer wiring 136 and interposer connecting terminals 130_1 and 130_2 are formed on an interposer substrate. The interposer substrate may be a glass substrate or a silicon substrate. The interposer wiring 136 may include a wiring formed of Au, Al, Cu, or any other suitable metal, and may be formed on the interposer 130 in relief or may be formed as a damascene wiring.

First channel terminals 122 provided on the second semiconductor chip 120 may be connected to first interposer connecting terminals 130_1 on the interposer 130, respectively. One ends of the interposer wiring 136 may be connected to the first interposer connecting terminals 130_1 and the other ends of the interposer wiring 136 may be connected to second interposer connecting terminals 130_2, respectively. In addition, the second interposer connecting terminals 130_2 may be connected to terminals 111a_2 on the first semiconductor chip 111a, respectively.

Figure 5:
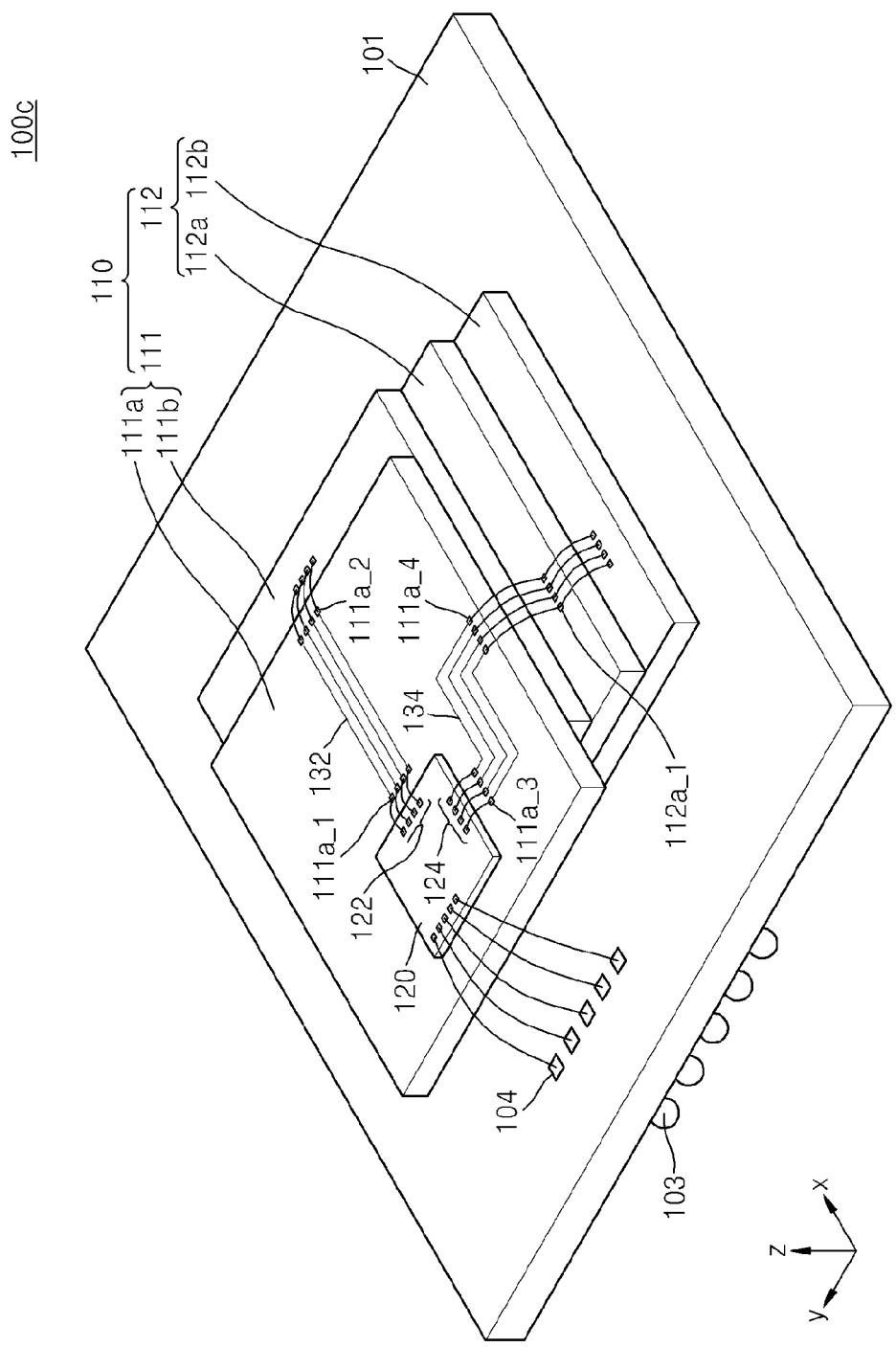

FIG. 5 is an isometric view of a semiconductor package 100c according to another embodiment of the inventive concept.

Referring to FIG. 5, a plurality of first semiconductor chips 110 may be stacked on a substrate 101, and a second semiconductor chip 120 may be disposed on the stacked first semiconductor chips 110.

The substrate 101, the plurality of first semiconductor chips 110, and the second semiconductor chip 120 have been described in detail in the embodiment of FIG. 2, and thus the detailed description thereof will be omitted.

In the embodiment of FIG. 2, the second semiconductor chip 120 is electrically connected to the second semiconductor chip group 112 through the second channel by being connected to the first substrate terminals 101_1 in the substrate 101. Then the first substrate terminals 101_1 are connected to the second substrate terminals 101_2 via the substrate wiring 105 and the second substrate terminals 101_2 are connected to the terminals 112a_1 of the second semiconductor chip group 112. On the other hand, in the embodiment of FIG. 5, the second semiconductor chip 120 may be electrically connected to a first semiconductor chip group 111 through a first channel by using conductive lines in a redistribution layer 132, and the second semiconductor chip 120 may be electrically connected to the second semiconductor chip group 112 through a second channel by using conductive lines in a redistribution layer 134.

More specifically, the redistribution layer 134 may further be provided on the top surface of a first semiconductor chip 111a which is located on the uppermost side of the first semiconductor chip group 111. The second semiconductor chip 120 may be disposed directly on the first semiconductor chip 111a, and second channel terminals 124 of the second semiconductor chip 120 may be connected to one ends of the conductive lines in the redistribution layer 134 through terminals 111a_3.

The other end of the conductive lines in the redistribution layer 134 may extend up to the vicinity of an edge of the first semiconductor chip 111a so as to be electrically connected to terminals 111a_4 to be connected to a first semiconductor chip 112a of the second semiconductor chip group 112 disposed below the first semiconductor chip group 111.

For example, the redistribution layer 134 may be formed on a passivation layer of the first semiconductor chip 111a, and may be a wiring formed of Al, Cu, Au, or any other suitable metal. Although FIG. 5 illustrates that the redistribution layer 134 is exposed, the redistribution layer may be configured to be formed within or on a separate interlayer dielectric (ILD) below the passivation layer of the first semiconductor chip 111a that is then covered by the passivation layer.

The terminals 111a_4 provided at the other end of the redistribution layer 134 may be connected to terminals 112a_1 of the first semiconductor chip 112a of the second semiconductor chip group 112 by using bonding wires, but the inventive concept is not limited thereto. For example, the terminals 111a_4 provided at the other end of the redistribution layer 134 may be connected to each other using another connecting method such as a through silicon via (TSV) or a solder bump.

In addition, although FIG. 5 illustrates that electrical connection between the first semiconductor chips 112a and 112b of the second semiconductor chip group 112 is made by the bonding wires, the inventive concept is not limited thereto. The first semiconductor chips 112a and 112b may be connected to each other using another connecting method such as a through silicon via (TSV), a solder bump, or any other suitable electrical connector.

As described above by reference to FIG. 2, first semiconductor chips 110 may be stacked while being offset in a uniform direction. Alternatively, as illustrated in FIG. 5, a direction in which the first semiconductor chips 111a and 111b of the first semiconductor chip group 111 may be laterally (and vertically) offset from one another may be different from a direction in which the second semiconductor chips 112a and 112b of the second semiconductor chip group 112 may be laterally offset from one another. In particular, the direction in which the first semiconductor chips 111a and 111b of the first semiconductor chip group 111 may be laterally offset from one another may be perpendicular to the direction in which the second semiconductor chips 112a and 112b of the second semiconductor chip group 112 may be laterally offset from one another.

In particular, as illustrated in FIG. 5, the first semiconductor chips 111a and 111b of the first semiconductor chip group 111 may be offset from one another in a first direction (x direction), whereas the second semiconductor chips 112a and 112b of the second semiconductor chip group 112 may be offset from one another in a second direction (y direction). In this case, the terminals 111a_4 connected to the other end of the redistribution layer 134 may be disposed along the edge of the first semiconductor chip 111a on the side where the first semiconductor chips 112a and 112b of the second semiconductor chip group 112 may be laterally offset from one another.

As illustrated in FIG. 5, the second semiconductor chip 120 may be configured to transmit and receive signals/data to and from any channel of the first semiconductor chip 110 without passing through the substrate 101. When the second semiconductor chip 120 and the first semiconductor chip 110 are connected to each other without passing through the substrate 101, the low-priced substrate 101 as described above with reference to FIG. 3 may be used, and thus a lower cost product may be produced.

Figure 6:
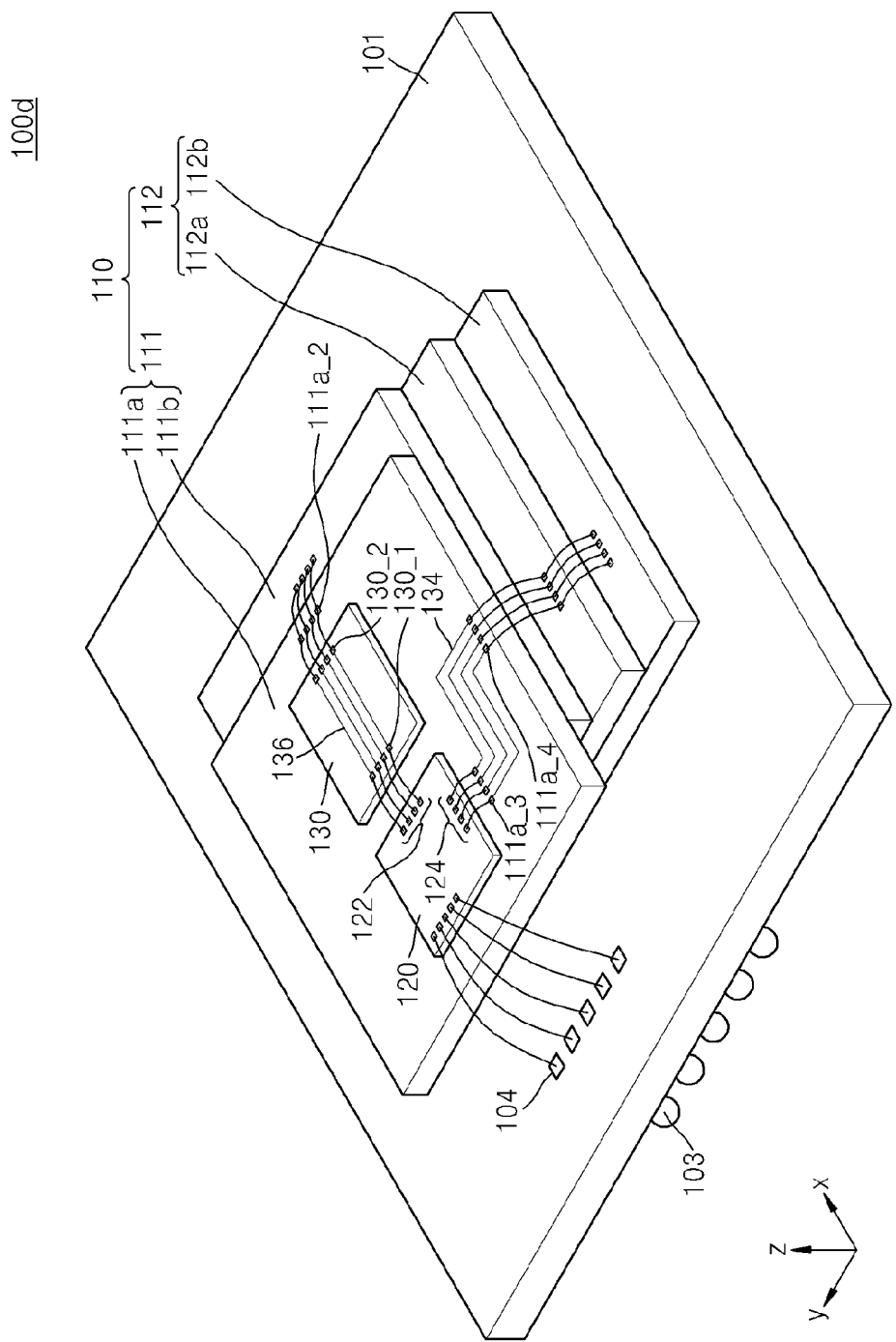

FIG. 6 is an isometric view of a semiconductor package 100d according to another embodiment of the inventive concept. Referring to FIG. 6, a plurality of first semiconductor chips 110 may be stacked on a substrate 101, and a second semiconductor chip 120 may be disposed on the stacked first semiconductor chips 110.

The substrate 101, the plurality of first semiconductor chips 110, and the second semiconductor chip 120 have been described in detail in the embodiment of FIG. 2, and thus the detailed description thereof will be omitted.

Referring still to FIG. 6, the second semiconductor chip 120 may be connected to first semiconductor chips 111a and 111b of a first semiconductor chip group 111 through an interposer 130, and may be connected to first semiconductor chips 112a and 112b of a second semiconductor chip group 112 through a redistribution layer 134.

A connection method through the interposer 130 has been described above in detail with reference to FIG. 4, and a connection method through the redistribution layer has been described above in detail with reference to FIG. 5, and thus an additional description will be omitted.

Although FIG. 6 illustrates that only two channels are connected to the second semiconductor chip 120, a greater number of channels may be connected to the second semiconductor chip 120. In addition, one or more channels of the two or more channels may connect the second semiconductor chip and the first semiconductor chips to each other through an interposer, and one or more channels may connect the second semiconductor chip and the first semiconductor chips to each other through a redistribution layer. In other words, two or more channels may connect the second semiconductor chip and the first semiconductor chips to each other through the interposer, and/or two or more channels may connect the second semiconductor chip and the first semiconductor chips to each other through the redistribution layer.

Figure 7A:
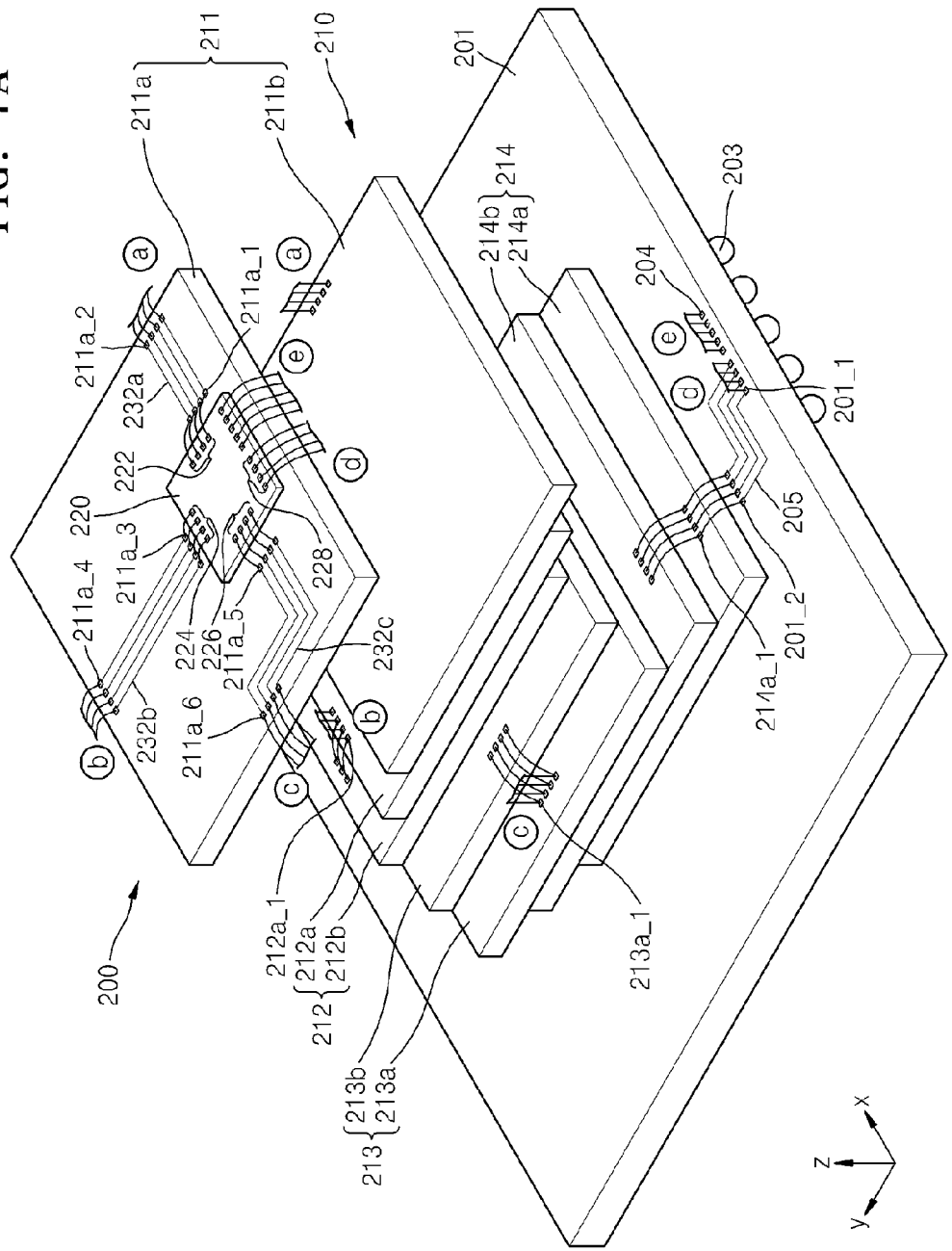
FIG. 7A is an isometric view illustrating a semiconductor package according to another embodiment of the inventive concept.
Figure 7B:
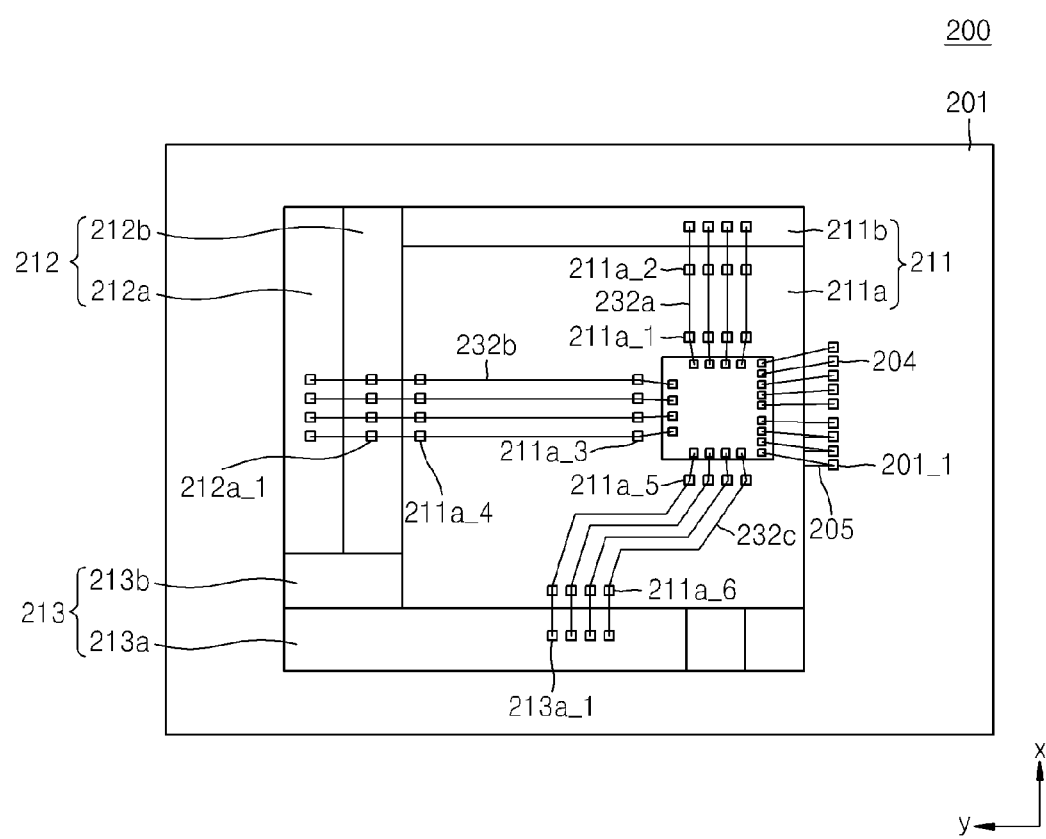
FIG. 7B is a plan view of the semiconductor package of FIG. 7A.
Figure 7C:
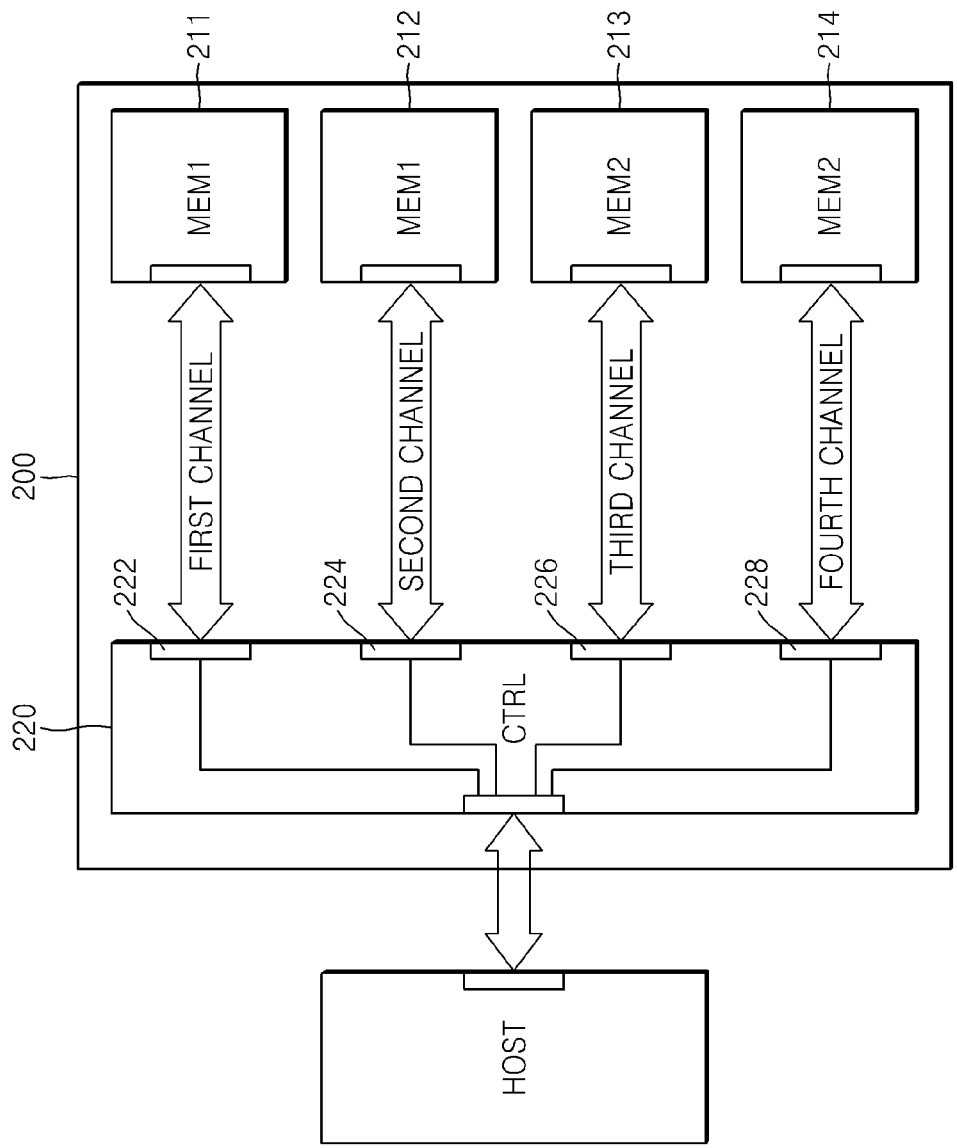
FIG. 7C is a conceptual diagram illustrating a connection relation of the embodiment of FIG. 7A.

FIG. 7A is an isometric view illustrating a semiconductor package 200 according to another embodiment of the inventive concept. In the embodiment of FIG. 7A, first semiconductor chips 210 and a second semiconductor chip 220 may be connected to each other through four channels. FIG. 7B is a plan view of the semiconductor package 200 of FIG. 7A, and FIG. 7C is a conceptual diagram illustrating a connection relation of the embodiment of FIG. 7A. FIGS. 7B and 7C are deemed to be largely self-explanatory in view of FIG. 7A and its detailed description below.

Referring collectively to FIGS. 7A and 7B, the first semiconductor chips 210 may be stacked on a substrate 201, and the second semiconductor chip 220 may be disposed on the first semiconductor chips 210. In FIG. 7A, a first semiconductor chip 211a disposed on the uppermost side in the first semiconductor chips 210 is shown in an exploded manner for the purpose of clarifying the connection relation.

The substrate 201 is configured in the same manner as those described with reference to FIGS. 2 and 3, and thus the detailed description thereof will be omitted.

The plurality of first semiconductor chips 210 may be divided into a first semiconductor chip group 211, a second semiconductor chip group 212, a third semiconductor chip group 213, and a fourth semiconductor chip group 214. The first semiconductor chip group 211 may transmit and receive signals and/or data to the second semiconductor chip 220 through a first channel. The second semiconductor chip group 212 may transmit and receive signals and/or data to the second semiconductor chip 220 through a second channel. The third semiconductor chip group 213 may transmit and receive signals and/or data to the second semiconductor chip 220 through a third channel. The fourth semiconductor chip group 214 may transmit and receive signals and/or data to the second semiconductor chip 220 through a fourth channel.

The first semiconductor chip group 211 may include one or more first semiconductor chips. Herein, although a case where the first semiconductor chip group 211 includes two first semiconductor chips 211a and 211b has been described, the number of first semiconductor chips included in the first semiconductor chip group 211 may be one or may be more than two.

Similarly, the second semiconductor chip group 212, the third semiconductor chip group 213, and the fourth semiconductor chip group 214 may each independently include one or more first semiconductor chips. Described and illustrated herein are a second semiconductor chip group 212 that includes two first semiconductor chips 212a and 212b, a third semiconductor chip group 213 that includes two first semiconductor chips 213a and 213b, and a fourth semiconductor chip group 214 that includes two first semiconductor chips 214a and 214b. Those of skill in the art will appreciate that the number of first semiconductor chips included in each of the second semiconductor chip group 212, the third semiconductor chip group 213, and the fourth semiconductor chip group 214 may be any positive integer, e.g. as few as one or as many as three or more.

The first semiconductor chip group 211, the second semiconductor chip group 212, the third semiconductor chip group 213, and the fourth semiconductor chip group 214 may be stacked while being offset in a uniform direction, or may be stacked while being offset in two or more directions as illustrated in FIGS. 7A and 7B. Although FIGS. 7A and 7B illustrate that the first semiconductor chip group 211, the second semiconductor chip group 212, the third semiconductor chip group 213, and the fourth semiconductor chip group 214 are sequentially disposed from above, the inventive concept is not limited thereto.

The second semiconductor chip 220 may be connected to the substrate 201 in order to communicate with an external device. More specifically, the second semiconductor chip 220 may electrically be connected to terminals 204 on the top surface of the substrate 201 in order to communicate with the external device. The terminals 204 on the top surface of the substrate 201 may be electrically connected to terminals 203 on the bottom surface of the substrate 201, and the terminals 203 on the bottom surface may be electrically connected to the external device.

Referring to FIG. 7C, the second semiconductor chip 220 may be configured to transmit and receive signals/data to and from the first semiconductor chips 110 through a first channel, a second channel, a third channel, and a fourth channel. The second semiconductor chip 120 may be provided with first channel terminals 222 to be connected to the first semiconductor chips through the first channel, second channel terminals 224 to be connected to the first semiconductor chips through the second channel, third channel terminals 226 to be connected to the first semiconductor chips through the third channel, and fourth channel terminals 228 to be connected to the first semiconductor chips through the fourth channel.

A redistribution layer 232a may be provided on the top surface of the first semiconductor chip 211a which is located on the uppermost side of the first semiconductor chip group 211 transmitting and receiving signals/data to and from the second semiconductor chip 220 through the first channel. As illustrated in FIG. 7A, the second semiconductor chip 220 may be disposed directly on the first semiconductor chip 211a, and the first channel terminals 222 may be connected to one ends of conductive lines in a redistribution layer 232a through terminals 211a_1 on the first semiconductor chip 211a.

The other ends of the conductive lines in the redistribution layer 232a may extend up to the vicinity of an edge of the first semiconductor chip 211a so as to be electrically connected to terminals 211a_2 to be connected to a first semiconductor chip 211b disposed below the first semiconductor chip 211a. An internal circuit of the first semiconductor chip 211a may be electrically connected to any one of the terminals 211a_1 and 211a_2 at either or both ends of the conductive lines in the redistribution layer 232a.

For example, the redistribution layer 232a may be formed on a passivation layer of the first semiconductor chip 211a, and may be a wiring formed of Al. Cu, and/or Au. Although FIG. 7A illustrates that the redistribution layer 232a is exposed, the redistribution layer may be configured to be formed within a separate interlayer dielectric (ILD) below the passivation layer of the first semiconductor chip 211a that is then covered by the passivation layer.

Although FIG. 7A illustrates that electrical connection between the first semiconductor chips 211a and 211b of the first semiconductor chip group 211 is made by the bonding wires, the inventive concept is not limited thereto. The first semiconductor chips 211a and 211b may be connected to each other using another connecting method such as a through silicon via (TSV), a solder bump, or any other suitable electrical connector.

In FIG. 7A, upper and lower portions of a group of bonding wires shown as ⓐ are connected to each other, and a portion shown by a wavy line indicates the omission of the center portion thereof for the purpose of clarifying the illustration of other portions. The same is true of grouped bonding wires ⓑ, ⓒ, ⓓ and ⓔ.

The second semiconductor chip 220 is electrically connected to the second semiconductor chip group 212 and the third semiconductor chip group 213 through the second channel and the third channel, respectively. In particular, the second semiconductor chip 220 may be electrically connected to the second semiconductor chip group 212 through the second channel by using a redistribution layer 232b. In addition, the second semiconductor chip 220 may be electrically connected to the third semiconductor chip group 213 through the third channel by using a redistribution layer 232c.

More specifically, the redistribution layers 232b and 232c may be provided on the top surface of the first semiconductor chip 211a which is at the top of the first semiconductor chip group 211, or at the top of the stacked plurality of first semiconductor chips. The second channel terminals 224 may be connected to one ends of conductive lines in the redistribution layer 232b through terminals 211a_3 on the first semiconductor chip 211a, and the third channel terminals 226 may be connected to one ends of conductive lines in the redistribution layer 232c through terminals 211a_5 on the first semiconductor chip 211a.

The other ends of the conductive lines in the redistribution layers 232b and 232c may extend up to the vicinity of edges of the first semiconductor chip 211a so as to be electrically connected to terminals 211a_4 and 211a_6 to be connected to the first semiconductor chips 212a and 213a of the second semiconductor chip group 212 and third semiconductor chip group 213 which are disposed below the first semiconductor chip 211a.

The terminals 211a_4 and 211a_6 provided at the other ends of the conductive lines in the redistribution layers 232b and 232c may be connected to terminals 212a_1 of the first semiconductor chip 212a of the second semiconductor chip group 212 and terminals 213a_1 of the first semiconductor chip 213a of the third semiconductor chip group 213, respectively, by using bonding wires, but the inventive concept is not limited thereto.

The second semiconductor chip 220 may be connected to the substrate 201 in order to be electrically connected to the fourth semiconductor chip group 214 through the fourth channel. That is, the fourth channel terminals 228 may be first connected to first substrate terminals 201_1. The first substrate terminals 201_1 may be electrically connected to second substrate terminals 201_2 which are disposed in the vicinity of terminals 214a_1 of the first semiconductor chip 214a located on the lowermost side of the fourth semiconductor chip group 214, through a substrate wiring 205.

The second substrate terminals 201_2 may be electrically connected to the terminals 214a_1 of the first semiconductor chip 214a.

Whereas FIG. 7A illustrates that electrical connection between the first semiconductor chips 214a and 214b of the fourth semiconductor chip group 214 is made by the bonding wires, the inventive concept is not limited thereto. The first semiconductor chips 214a and 214b may be connected to each other using another connecting method such as a through silicon via (TSV), a solder bump, or any other suitable electrical connector.

Also whereas FIG. 7A illustrates that all the first channel terminal 222, the second channel terminal 224, the third channel terminal 226, and the fourth channel terminal 228 are disposed at different edges of the second semiconductor chip 220, two or more channel terminals may be disposed at one edge of the second semiconductor chip 220.

As illustrated in FIGS. 7A and 7B, only the fourth channel among the first to fourth channels is connected to the fourth semiconductor chip group 214 via the substrate 201. When two or more channels connect the second semiconductor chip 220 and the first semiconductor chips 210 via the substrate 201, routing of the substrate 201 becomes highly complicated. Thus, in this case, the substrate illustrated in FIG. 3 may not be capable of accommodating the routing, and only a substrate including three or more wiring layers may be capable of accommodating the routing.

FIGS. 2, 4, 5, 6, and 7A illustrate what is referred to herein as outwardly and downwardly cascading electrical conductors, e.g. bonding wires and/or TSVs and/or solder bumps, that convey signals associated with the various channels that electrically interconnect the first semiconductor chips, e.g. memory devices, and the second semiconductor chip, e.g. a memory controller device.

Figure 8:
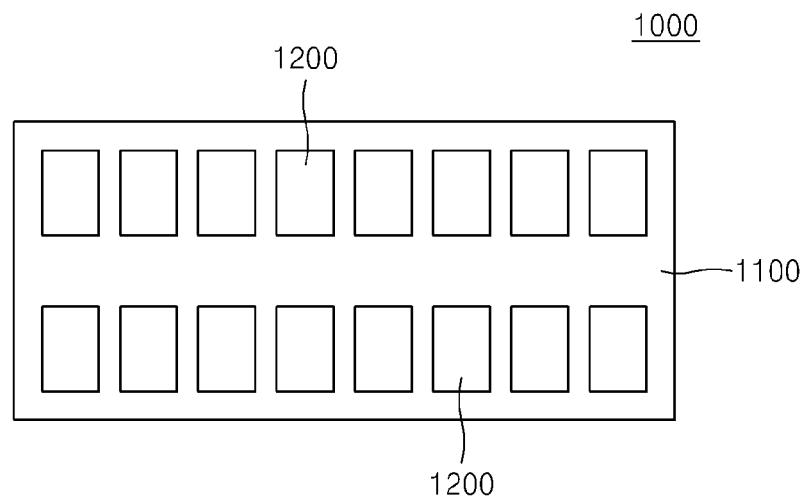
FIG. 8 is a plan view of a memory module including the semiconductor package according to the inventive concept.

FIG. 8 is a plan view of a memory module 1000 including the semiconductor package according to the inventive concept.

Referring to FIG. 8, the memory module 1000 may include a printed circuit board 1100 and a plurality of semiconductor packages 1200.

The plurality of semiconductor packages 1200 may be the semiconductor packages according to the inventive concept or may include the semiconductor packages. In particular, the plurality of semiconductor packages 1200 may include at least one semiconductor package selected from the semiconductor packages according to the inventive concept.

The memory module 1000 according to the inventive concept may be a single in-line memory module (SIMM) in which the plurality of semiconductor packages 1200 are mounted on only one surface of a printed circuit board, or may be a dual in-line memory module (DIMM) in which the plurality of semiconductor packages 1200 are arrayed on both surfaces. In addition, the memory module 1000 according to the inventive concept may be a fully buffered DIMM (FB-DIMM) including an advanced memory buffer (AMB) that provides signals input from the outside to the plurality of semiconductor packages 1200.

Figure 9:
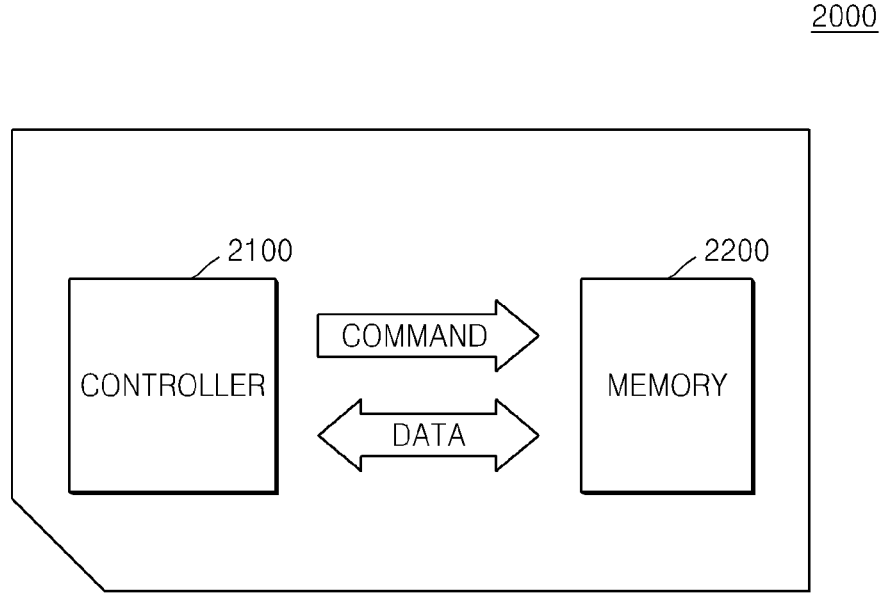
FIG. 9 is a schematic diagram of a memory card including the semiconductor package according to the inventive concept.

FIG. 9 is a schematic diagram of a memory card 2000 including the semiconductor package according to the inventive concept.

Referring to FIG. 9, the memory card 2000 may be disposed such that a controller 2100 and a memory 2200 exchange electrical signals. For example, when the controller 2100 issues a command, the memory 2200 may transmit data.

The memory 2200 may include any of the semiconductor packages according to the embodiments of the inventive concept. In particular, the memory 2200 may include a structure of at least one semiconductor package selected from among the semiconductor packages according to the embodiments of the inventive concept.

The memory card 2000 may constitute various types of cards, for example, various types of memory cards such as a memory stick card, a smart media card (SM), a secure digital card (SD), a mini-secure digital card (SD), or a multimedia card (MMC).

Figure 10:
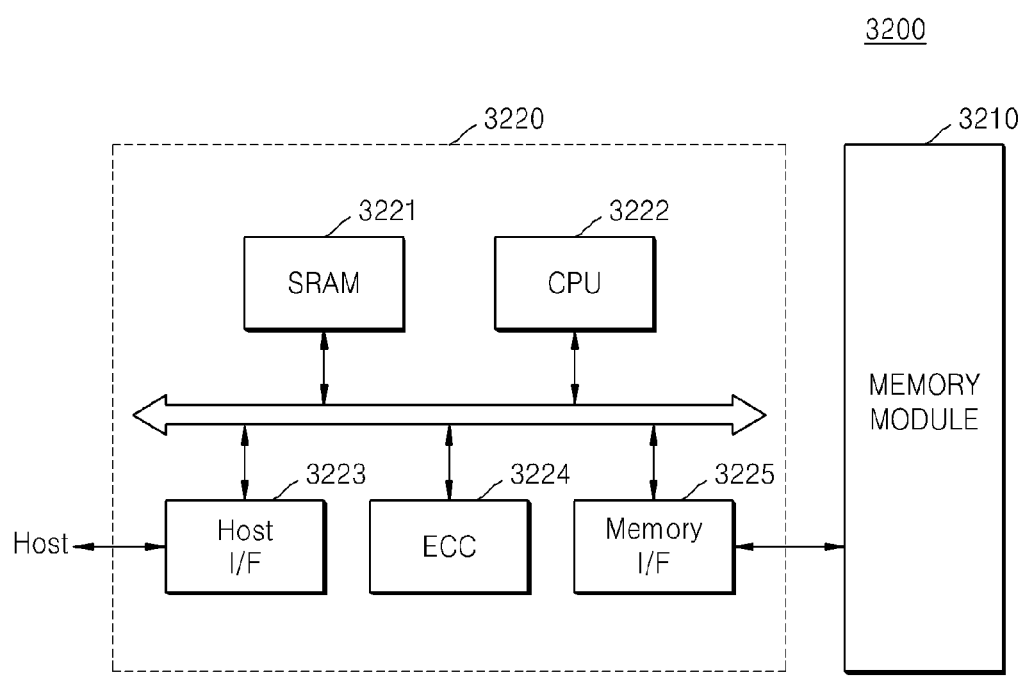
FIG. 10 is a block diagram illustrating an example of a memory device including the semiconductor package according to the inventive concept.

FIG. 10 is a block diagram illustrating an example of a memory device 3200 including the semiconductor package according to the inventive concept.

Referring to FIG. 10, the memory device 3200 according to the current embodiment includes a memory module 3210. The memory module 3210 may include at least one of the semiconductor packages described in the above-described embodiments. In addition, the memory module 3210 may further include a different type of semiconductor storage element (for example, a nonvolatile storage device and/or an SRAM). The memory device 3200 may include a memory controller 3220 that controls data exchange between a host and the memory module 3210.

The memory controller 3220 may include a central processing unit (CPU) 3222 that controls the overall operation of a memory card. In addition, the memory controller 3220 may include an SRAM 3221 which is used as an operation memory of the CPU 3222. In addition, the memory controller 3220 may further include a host interface 3223 and a memory interface 3225. The host interface 3223 may include a data exchange protocol between the memory device 3200 and the host. The memory interface 3225 may connect the memory controller 3220 and the memory module 3210 to each other. Furthermore, the memory controller 3220 may further include an error correction block (ECC) 3224. The error correction block 3224 may detect and correct an error of data which is read out from the memory module 3210. Although not shown in FIG. 10, the memory device 3200 may further include a read-only memory (ROM) device that stores code data for interfacing with the host. The memory device 3200 may be configured as a solid state drive (SSD) that may be replaced with a hard disk of a computer system.

Figure 11:
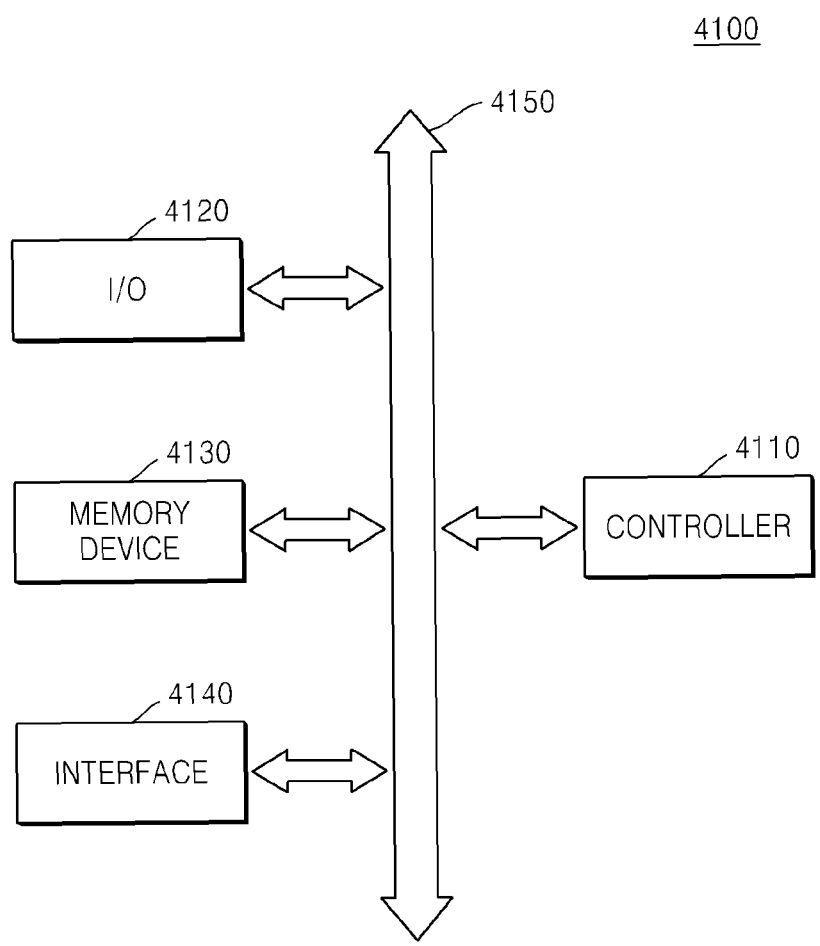
FIG. 11 is a block diagram illustrating an example of an electronic system including the semiconductor package according to the inventive concept.

FIG. 11 is a block diagram illustrating an example of an electronic system 4100 including the semiconductor package according to the inventive concept. Referring to FIG. 11, the electronic system 4100 according to the current embodiment of the inventive concept may include a controller 4110, an input and output device (I/O) 4120, a memory device 4130, an interface 4140, and a bus 4150. The controller 4110, the input and output device 4120, the memory device 4130, and/or the interface 4140 may be coupled to each other through the bus 4150. The bus 4150 is equivalent to a path along which data move.

The controller 4110 may include at least one selected from among a microprocessor, a digital signal processor, a microcontroller, and logic elements capable of performing similar functions as these. The I/O 4120 may include a keypad, a keyboard, a display device, or the like. The memory device 4130 may store data and/or commands. The memory device 4130 may include at least one of the semiconductor packages described in the above-described embodiments. In addition, the memory device 4130 may further include a different type of semiconductor memory device (for example, a nonvolatile storage device and/or an SRAM). The interface 4140 may transmit data through a communication network or may receive data from the communication network. The interface 4140 may be a wired or wireless interface. For example, the interface 4140 may include an antenna or a wired/wireless transceiver. Although not shown in FIG. 11, the electronic system 4100 may further include a high-speed DRAM, an SRAM, or the like, as an operation memory device for improving an operation of the controller 4110.

The electronic system 4100 may be applied to a personal digital assistant (PDA), a portable computer, a web tablet, a wireless phone, a mobile phone, a digital music player, a memory card, or any other suitable electronic products capable of transmitting and/or receiving information within a wireless environment.

While the inventive concept has been particularly shown and described with reference to exemplary embodiments thereof, it will be understood that various changes in form and details may be made therein without departing from the spirit and scope of the following claims.

What is claimed is:
1. A semiconductor package, comprising:
a plurality of first semiconductor chips that are stacked on a substrate; and
a second semiconductor chip disposed on the plurality of first semiconductor chips,
wherein the plurality of first semiconductor chips comprise a first semiconductor chip group and a second semiconductor chip group,
wherein the first semiconductor chip group is electrically connected to the second semiconductor chip through a first channel, the first channel not being electrically connected to the second semiconductor chip group,
wherein the second semiconductor chip group is electrically connected to the second semiconductor chip through a second channel, the second channel not being electrically connected to the first semiconductor chip group,
wherein the first channel extends along a top surface of a first semiconductor chip at a top of the stacked plurality of first semiconductor chips, and
wherein the second channel electrically connects the second semiconductor chip group to the second semiconductor chip through the substrate.

2. The semiconductor package of claim 1, wherein at least one of the first channel and the second channel extends by a redistribution layer or an interposer formed near a top surface of the first semiconductor chip at the top of the stacked plurality of first semiconductor chips.

3. The semiconductor package of claim 2, wherein the other one of the first channel and the second channel is configured to connect the first semiconductor chips and the second semiconductor chip to each other through the substrate.

4. The semiconductor package of claim 2, wherein the second semiconductor chip is electrically and directly connected to the substrate to be connected to an external device.

5. The semiconductor package of claim 1, wherein the second semiconductor chip is a controller for controlling the first semiconductor chips.

6. The semiconductor package of claim 1,
wherein the substrate comprises an insulator having a first surface and a second surface which is opposite to the first surface, a first substrate wiring formed on the first surface and a second substrate wiring formed on the second surface, and a via for connecting the first substrate wiring and the second substrate wiring, and
wherein an electrical wiring is not formed between the first surface and the second surface.

7. A semiconductor device comprising:
a plurality of memory devices that are stacked on a substrate; and
a controller device that is disposed on the plurality of memory devices, the controller device being configured to control the plurality of memory devices,
wherein the memory devices comprise a first semiconductor chip group and a second semiconductor chip group,
wherein the first semiconductor chip group is electrically connected to the controller device through a first channel, and the first channel not being electrically connected to the second semiconductor chip group,
wherein the second semiconductor chip group is electrically connected to the controller device through a second channel, and the second channel not being electrically connected to the first semiconductor chip group, and
wherein only the second channel electrically connects the controller device and the second semiconductor chip group via the substrate.

8. The semiconductor device of claim 7, wherein the first channel electrically connects the controller device and the first semiconductor chip group to each other via a top surface of the memory device at a top of the stacked plurality of memory devices.

9. The semiconductor device of claim 7,
wherein the plurality of memory devices further comprise a third semiconductor chip group and a fourth semiconductor chip group,
wherein the third semiconductor chip group is electrically connected to the controller device through a third channel,
wherein the fourth semiconductor chip group is electrically connected to the controller device through a fourth channel, and
wherein the first channel, the third channel, and the fourth channel electrically connect the controller device to the first semiconductor chip group, to the third semiconductor chip group, and to the fourth semiconductor chip group, respectively, via a top surface of a memory device at a top of the stacked plurality of memory devices.

10. The semiconductor device of claim 9, wherein at least one of the first channel, the third channel, and the fourth channel electrically connect the controller device to the first semiconductor chip group, to the third semiconductor chip group, and/or to the fourth semiconductor chip group, respectively, via a redistribution layer (RDL) disposed near a top surface of the memory device at the top of the stacked plurality of memory devices.

11. The semiconductor device of claim 10, wherein the RDL comprises a wiring formed of gold (Au), aluminum (Al), and/or copper (Cu).

12. The semiconductor device of claim 9, wherein at least one of the first channel, the third channel, and the fourth channel electrically connect the controller device to the first semiconductor chip group, to the third semiconductor chip group, and/or to the fourth semiconductor chip group, respectively, through an interposer disposed on a top surface of the memory device at the top of the stacked plurality of memory devices.

13. The semiconductor device of claim 12, wherein one of the first channel, the third channel, and the fourth channel electrically connects the controller device to the first semiconductor chip group, to the third semiconductor chip group, and/or to the fourth semiconductor chip group through a redistribution layer (RDL) disposed near the top surface of the memory device at the top of the stacked plurality of memory devices.

14. The semiconductor device of claim 9, wherein the plurality of memory devices are stacked while being laterally offset in two or more directions each of which is different from the others.

15. The semiconductor device of claim 7, wherein the substrate is a substrate having a 2-layer structure in which a wiring is formed only on both outer surfaces rather than being formed on an inside of the substrate.

16. A semiconductor package, comprising:
a substrate;
two or more first semiconductor chips in a first semiconductor group, the two or more first semiconductor chips in the first semiconductor group being stacked one atop the other above the substrate;
two or more first semiconductor chips in a second semiconductor group, the two or more first semiconductor chips in the second semiconductor group being stacked one atop the other above the substrate;
wherein the first and the second semiconductor groups being stacked one atop the other above the substrate;
a second semiconductor chip stacked above a top-most one of the first semiconductor chips; and
a channel corresponding to each of the first and second semiconductor groups, each channel electrically connecting the two or more first semiconductor chips of the corresponding semiconductor group to the second semiconductor chip, and each channel not being electrically connected to the two or more first semiconductor chips of the other semiconductor group not corresponding to the channel, and
wherein only one channel electrically connects the corresponding one of the first and second semiconductor groups to the second semiconductor chip through the substrate.

17. The semiconductor package of claim 16, wherein the first semiconductor chips within the first and second chip groups are memory devices, and wherein the second semiconductor chip is a memory controller device.

18. The semiconductor package of claim 16, wherein the substrate provides one or more input and/or output (I/O) terminals for external electrical connection to the semiconductor package.

19. The semiconductor package of claim 16, wherein the substrate comprises no more than two-layer structure characterized by one or two external surface wirings but no internal wirings.

20. The semiconductor package of claim 16, further comprising:
an interposer or a redistribution layer (RDL) on the top surface of a first semiconductor chip disposed at a top of the stack of the one or more first semiconductor groups.

* * * * *